United States Patent [19]

Holloway

[11] Patent Number: 4,543,561
[45] Date of Patent: Sep. 24, 1985

[54] SINGLE-SUPPLY IC DIGITAL-TO-ANALOG CONVERTER FOR USE WITH MICROPROCESSORS

[75] Inventor: Peter R. Holloway, Andover, Mass.

[73] Assignee: Analog Devices, Incorporated, Norwood, Mass.

[21] Appl. No.: 360,482

[22] Filed: Mar. 22, 1982

Related U.S. Application Data

[63] Continuation of Ser. No. 120,892, Feb. 12, 1980.

[51] Int. Cl.[4] ............................................. H03K 13/02
[52] U.S. Cl. ........................ 340/347 DA; 340/347 M; 340/347 CL; 330/257; 330/288
[58] Field of Search ... 340/347 DA, 347 M, 347 AD, 340/347 CL; 330/257, 288; 328/165

[56] References Cited

U.S. PATENT DOCUMENTS

| | | | |
|---|---|---|---|
| 3,660,773 | 5/1972 | Free | 330/257 |
| 3,836,907 | 9/1974 | Nercessian | 340/347 DA |
| 3,890,611 | 6/1975 | Pastoriza | 340/347 DA |
| 4,231,020 | 10/1980 | Azzis | 340/347 DA |

FOREIGN PATENT DOCUMENTS 2805835  8/1979  Fed. Rep. of Germany ...... 340/347 DA

OTHER PUBLICATIONS

Grant, Putting the AD558 Dacport TM on the Bus, Analog Dialogue, 14-2, 1980, pp. 16-17.
Clark, D/A Conversion with Single-Supply Circuit, Analog Dialogue, 10-1, 1976.
Amazeen et al., A Complete Single-Supply Microprocessor-Compatible—, IEEE Journal of Solid-State Circuits, vol. SC-15, No. 6, 12/1980, pp. 1059-1070.
Widlar, Low Voltage Techniques, IEEE Journal of Solid-State Circuits, vol. SC-13, No. 6, 12/1978, pp. 838-846.

Primary Examiner—T. J. Sloyan
Attorney, Agent, or Firm—Parmelee, Bollinger & Bramblett

[57] ABSTRACT

A single-chip 8-bit DAC with bipolar current sources, an output buffer amplifier for developing an output voltage, a regulated reference for producing a calibrated output, and operated by a single-voltage supply, e.g. +5 volts. The buffer amplifier includes means providing for driving the output voltage virtually to ground level when the DAC output is zero. The current sources comprise a single-transistor cell driven by an I$^2$L flip-flop circuit, and the reference supply is merged with the reference transistor circuit regulating the DAC current levels, both aiding in reducing required chip area. A highly efficient bias network is utilized to supply the high-level bias currents required.

21 Claims, 9 Drawing Figures

SINGLE-SUPPLY IC DIGITAL-TO-ANALOG CONVERTER FOR USE WITH MICROPROCESSORS

This is a continuation of application Ser. No. 120,892 filed Feb. 12, 1980.

BACKGROUND OF THE INVENTION

1. Field of the Invention

This invention relates to digital-to-analog converters. More particularly, this invention relates to monolithic converters that are especially adapted for operation with microprocessors, such as may be used in analog control systems.

2. Description of the Prior Art

A wide variety of digital-to-analog converters have been available now for some time. Such converters frequently employ current sources which are selectively-activated in accordance with a digital input signal. U.S. Pat. No. Re. 28,633 (Pastoriza) shows one highly successful converter design of that type. A more recent design is shown in U.S. Pat. No. 3,961,326 (Craven). Digital-to-analog converters also are employed in successive-approximation analog-to-digital converters such as disclosed in U.S. application Ser. No. 931,960 (Brokaw et al); the latter converter particularly is advantageous in that it incorporates inverted mode transistor circuitry (sometimes referred to as I²L, for "integrated injection logic"), together with bipolar transistor circuitry, on the same monolithic chip.

There have been proposals for converters especially suited for use with microprocessors, as for example described in the paper by Schoeff entitled "A Microprocessor Compatible High-Speed 8-Bit DAC", in the February, 1978, ISSCC Digest of Technical Papers, at pages 132–133.

Although many proposals have been put forward, none has provided a satisfactory converter capable of required performance, and yet suitably simple in design to be manufactured economically. Particularly, prior art designs have not provided a monolithic converter including a reference source and an amplifier to produce voltage output, all operable by a single supply, e.g. +5 volt. It is a principal object of this invention to provide solutions to the problems encountered in achieving that goal.

SUMMARY OF THE INVENTION

In accordance with one important aspect of the invention, there is disclosed herein a digital-to-analog converter incorporating a superior buffer amplifier capable of producing an output voltage between zero and some nominal value while operating from a single supply. In accordance with another aspect of the invention, there is provided a simplified one-transistor current-source cell capable of operation directly with I²L switching logic, to permit a significant reduction in part count of the chip. In still another aspect of this invention, a converter is provided having a novel simplified reference supply for regulating the gain of the current sources to stabilize the output current of the converter. In yet another aspect of the invention, a converter bias current network is provided having high efficiency, and thus reducing the required power while still achieving excellent performance.

Other objects, aspects and advantages of the invention will be pointed out in, or apparent from, the following detailed description of a preferred embodiment of the invention, considered together with the accompanying drawings.

DESCRIPTION OF A PREFERRED EMBODIMENT

Figure 1:
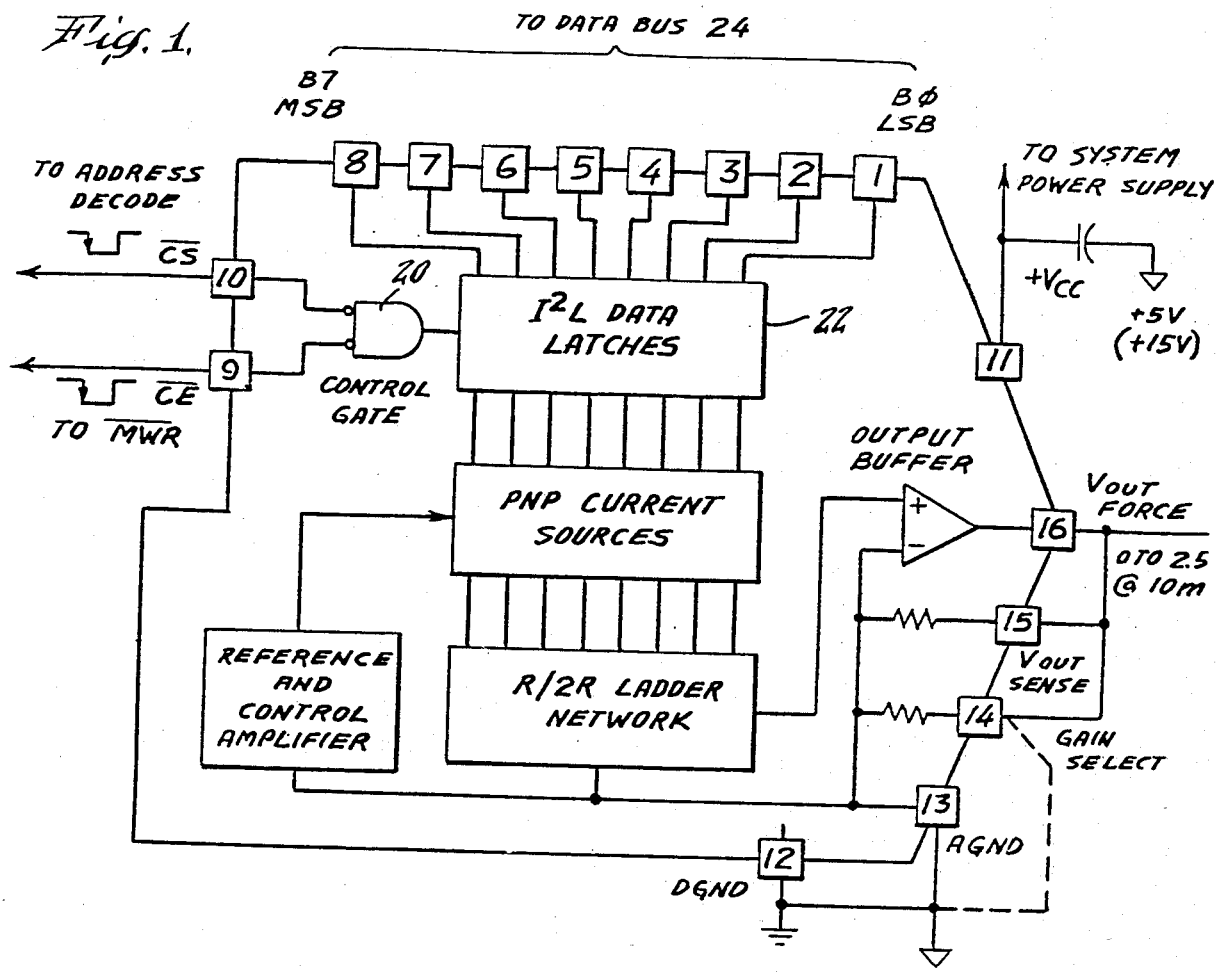
FIG. 1 is a block diagram illustrating the preferred embodiment.

Referring now to FIG. 1, the microprocessor logic control signals $\overline{CS}$ and $\overline{CE}$ are directed to a gate 20 which controls the I²L data latches generally indicated at 22. The latches are transparent to data on the data bus 24 when both $\overline{CE}$ and $\overline{CS}$ are at logic "∅". The input data is stored in the latches when either $\overline{CE}$ or $\overline{CS}$ goes to logic "1".

Figure 2A:
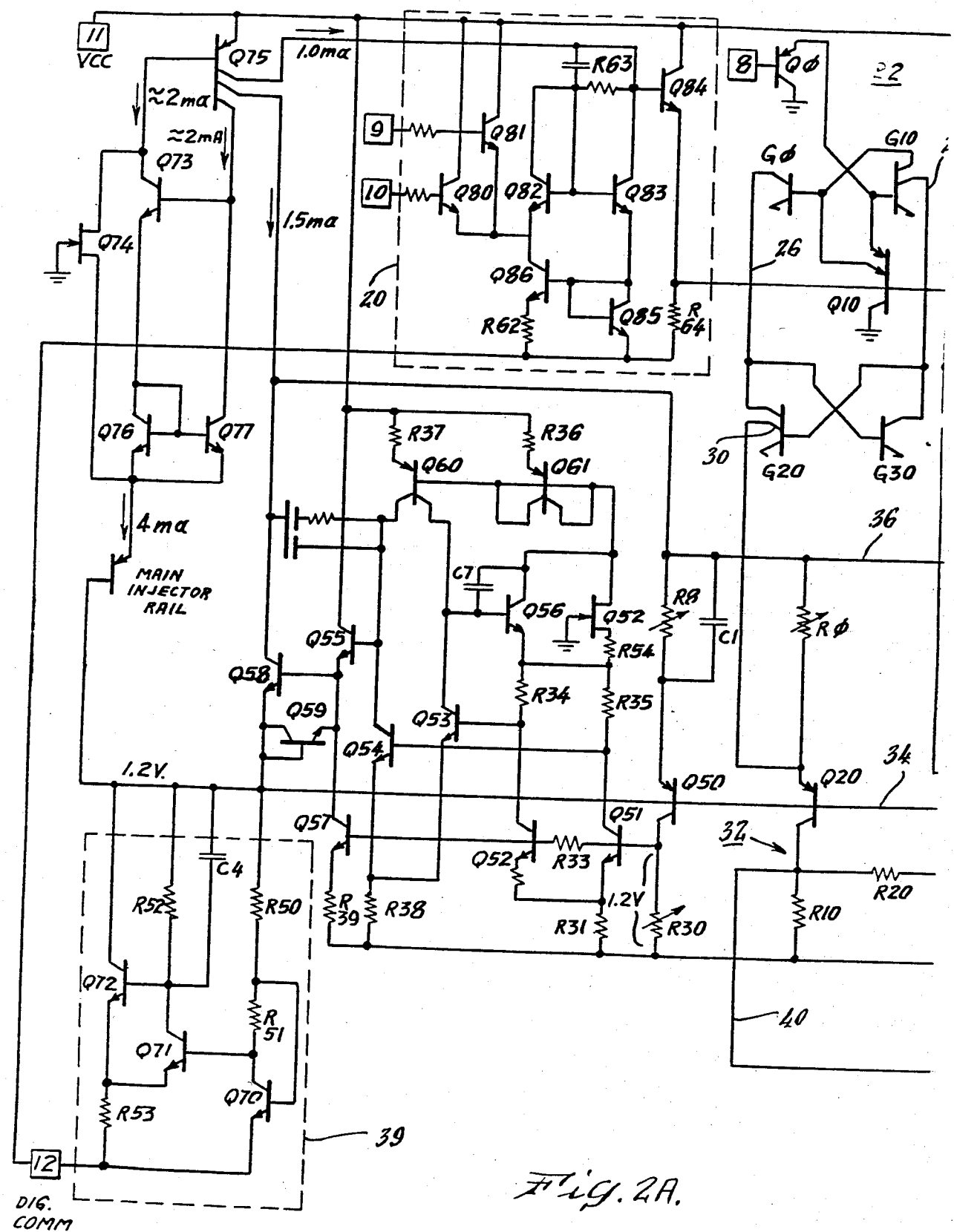
FIGS. 2A and 2B together present a detailed circuit diagram of the preferred embodiment.
Figure 2B:
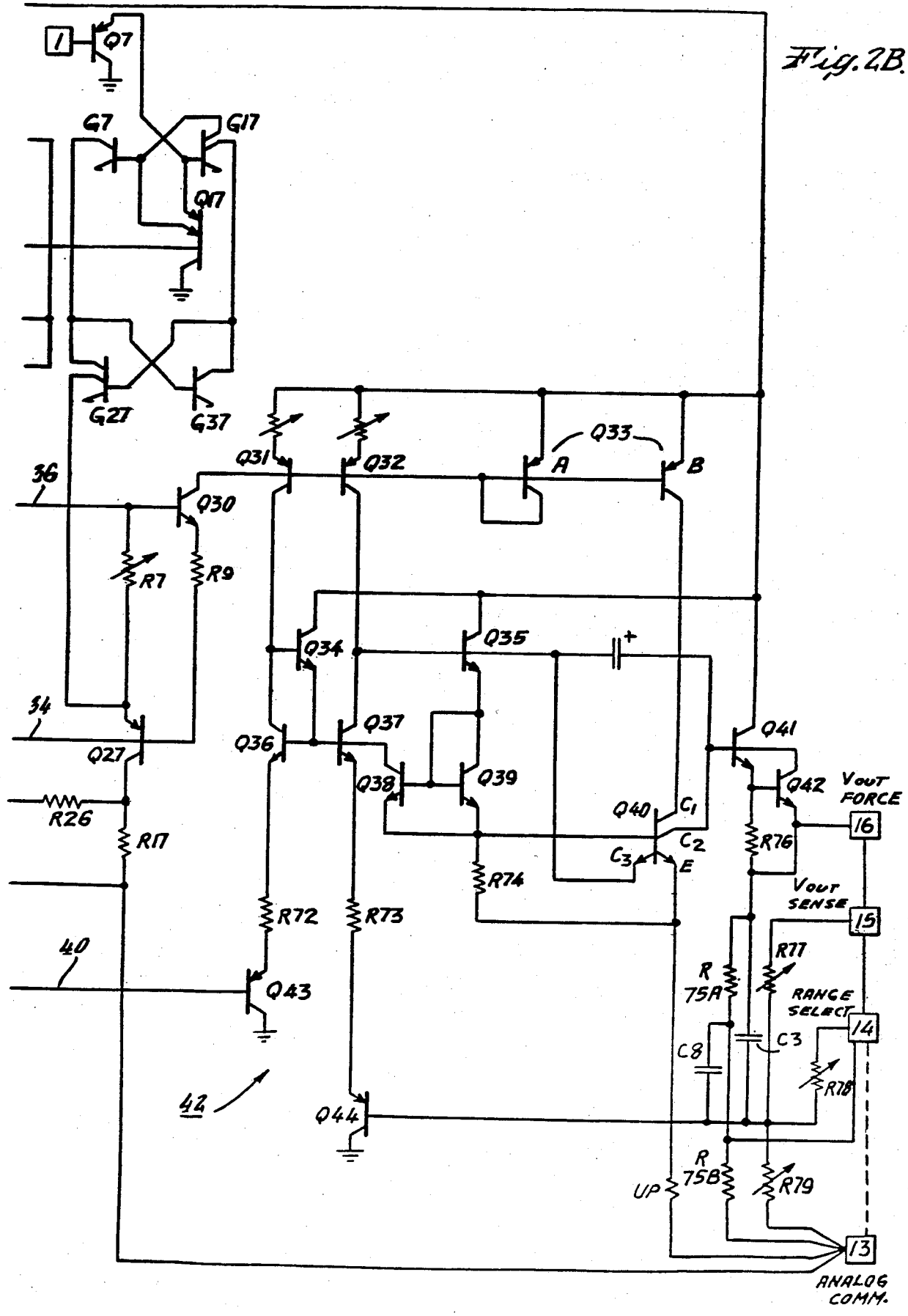

As shown in FIG. 2, the data latches 22 comprise eight I²L flip-flops G20/G30–G27/G37 (although for simplicity only the first and eighth are shown). The output of the control gate 20, which swings around 1.2 volts, is applied to the bases of eight transistors Q10–Q17 which act together with respective data input transistors Q∅–Q7 to control the initially disabled I²L gate pairs G∅/G10–G7/G17. Depending on the status of the input data, one or the other of the two gate lines 26, 28, etc., is pulled down to control the associated eight set/reset flip-flops G20/G30–G27/G37. If the left-hand flip-flop section (G20–G27) is turned on, current will flow through the associated collector 30, etc., connected to the emitter of a corresponding PNP current source transistor Q20–Q27. This current is drawn from the transistor emitter circuit, interrupting flow through the transistor to an R/2R ladder network generally indicated at 32, and which functions in the usual way to provide an analog output current corresponding to the binary input on the data bus 24.

Figure 3:
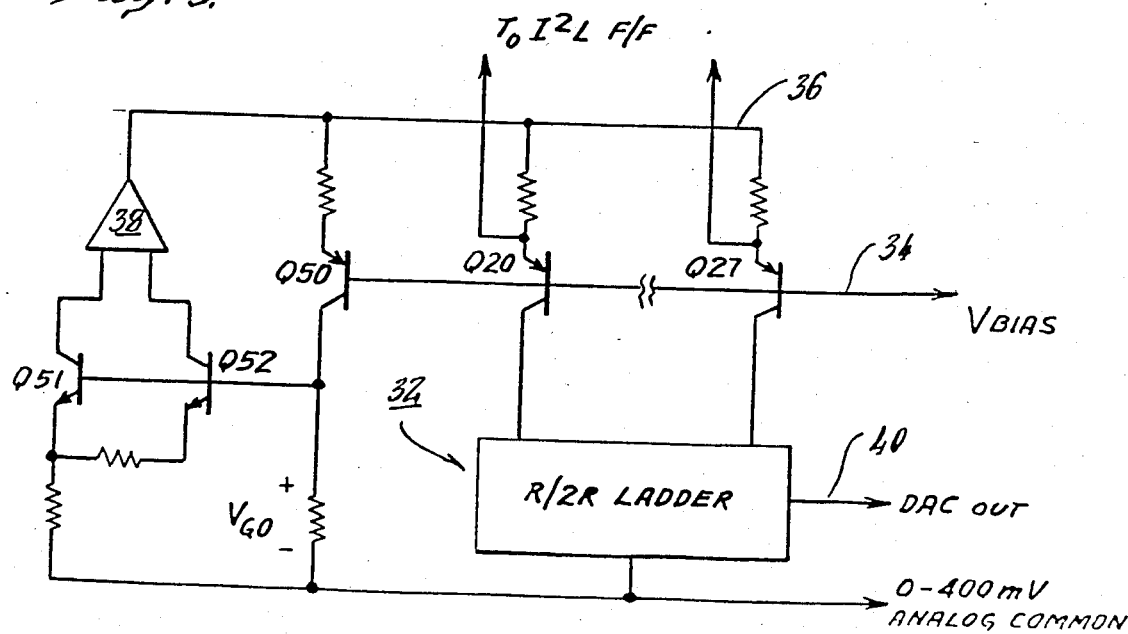
FIG. 3 is a diagrammatic presentation of the reference supply circuitry for the current sources.

Referring now in more detail to the current source transistors Q20–Q27, the voltage between the common base line 34 and the emitter-resistor rail 36 is controlled by a regulating reference source illustrated in simplified format in FIG. 3. This arrangement includes a band-gap cell of the type disclosed in U.S. Pat. No. 3,887,863 (Brokaw), having two transistors Q51 and Q52 with associated resistors R31 and R32 and operated at different current densities. As explained in that patent, the collector currents of the two transistors are sensed by an error amplifier 38. In the present arrangement, however, the amplifier output is directed to the emitter resistor rail 36 to which is connected a reference resistor R8 and a reference transistor Q50. These elements, together with another resistor R30, provide feedback to the bases of transistors Q51 and Q52, and drive the rail 36 to a voltage producing through R8 a feedback current which develops a voltage across R30 equal to the band-gap voltage ($V_{GO}$), e.g. essentially 1.205 V. for silicon. This sets the current through Q50 and all 8 DAC PNPs at a temperature independent 100 μA.

In the particular embodiment disclosed in FIG. 2, the differential error amplifier comprises Q53 and Q54, and a common emitter output amplifier Q58. The power supply rejection of the loop is enhanced by common-mode feedback through Q56, which fixes the collector base voltage of Q51 and Q52, and balances the error amplifier. A shunt regulator, generally indicated at 39 and of known design, biases the common base rail 34 at 1.2 V.

Figure 4:
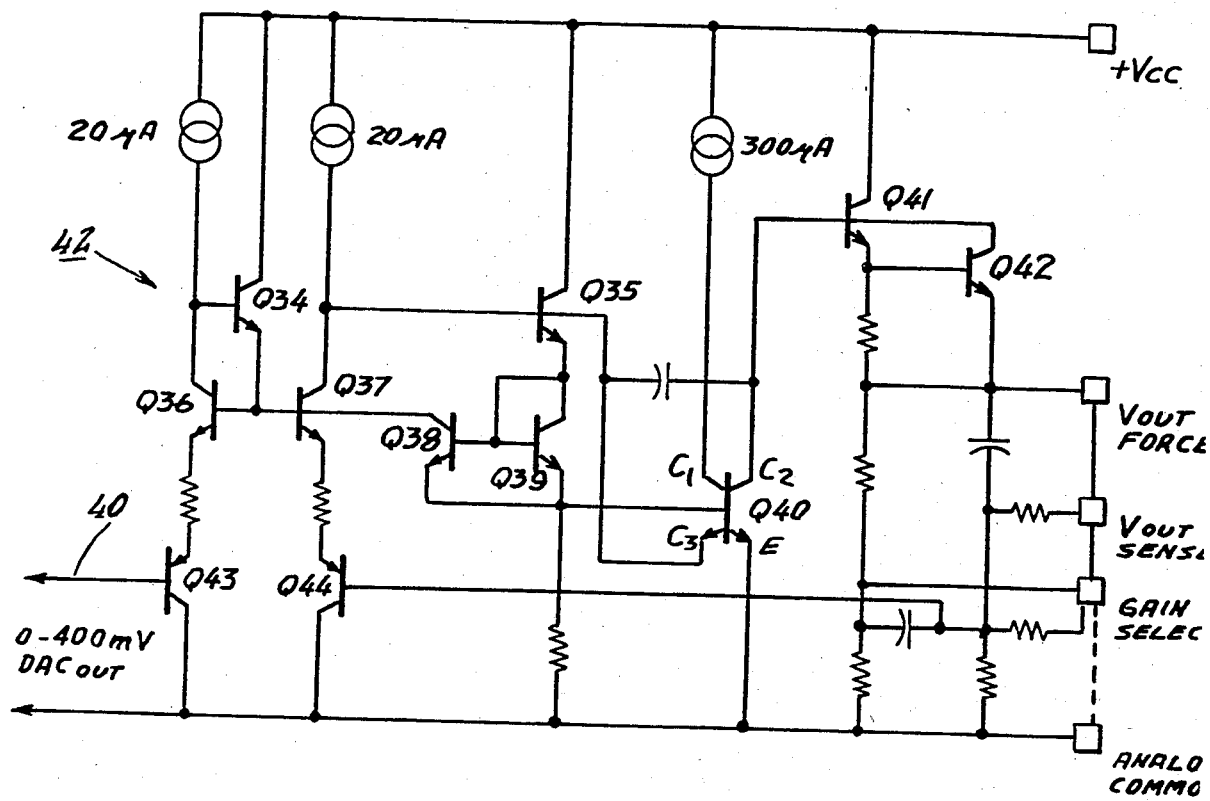
FIG. 4 shows aspects of the buffer amplifier.

Referring now to FIG. 4 together with FIG. 2, the output of the R/2R ladder 30 is directed along a line 40 to the output buffer amplifier generally indicated at 42 and including special features to accommodate the unipolar, ground referenced output swing of the R/2R ladder. This amplifier comprises a vertical PNP differential input pair Q43/Q44 with Q44 serving to provide a feedback signal corresponding to the amplifier output voltage. The ladder signal is coupled by Q43 up through a unique NPN current mirror circuit with transistors Q34–Q39. The signal passes from Q36 and Q34 to Q37 which drives Q35/Q39 controlling Q40, a special driver for the output emitter follower Q41 producing an output voltage at the $V_{OUT}$(FORCE) pin. This pin is connected to the $V_{OUT}$(SENSE) pin and to the Range Select pin for a 2.56 volt range. (Alternatively, the Range Select pin can be connected to analog common, to provide a 10 volt range.) The output voltage is fed back to the base of Q44, which functions to balance the signal from the R/2R ladder.

One of the principal problems in achieving a ground referenced output voltage swing in a single supply converter results from saturation in the output stage when the DAC signal level becomes very small, i.e. approaching zero, thus limiting the ability of the output stage to drive the output voltage down close to zero. In a normal amplifier, the consequent unbalance in the feedback causes the amplifier to tend to overdrive, thereby further intensifying the saturation problem. This problem has been solved by a special circuit arrangement now to be described.

Figure 7A:
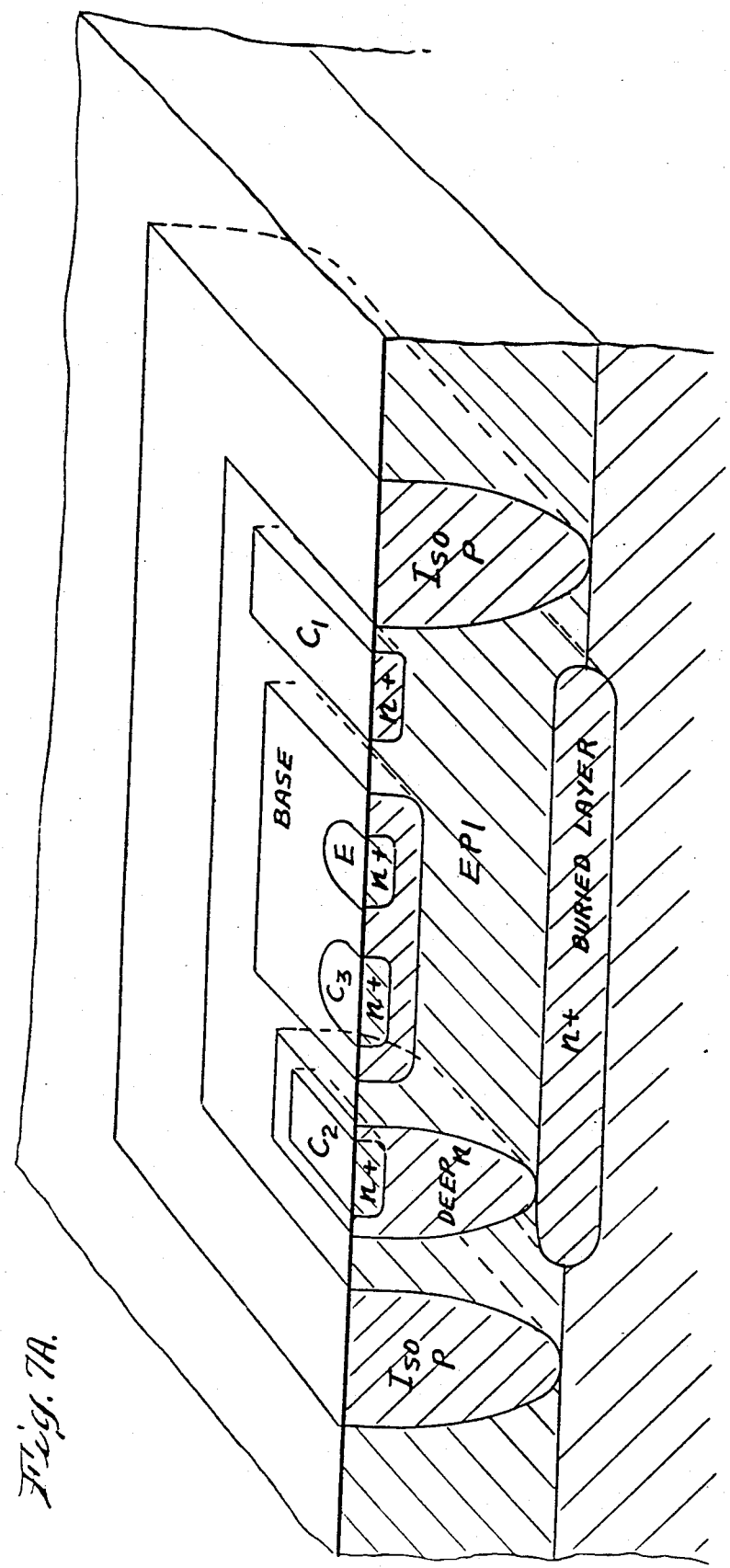
FIGS. 7A and 7B present a perspective section view of the structure of a drive transistor used in the buffer amplifier, and a schematic diagram of the elements of that transistor.
Figure 7B:
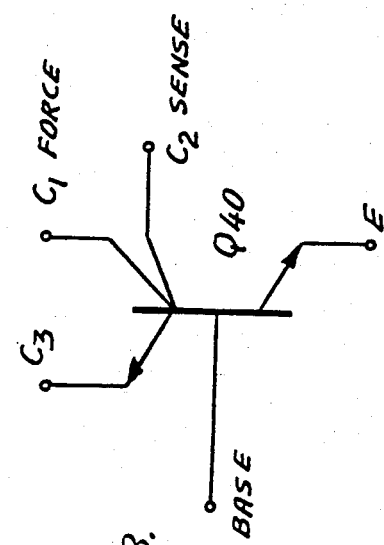

Referring also to FIG. 7, the output driver transistor Q40 includes the usual epitaxial layer, a collector $C_1$ (n+), and a base (p) having an emitter E (n+). In addition, the base is formed with a second n+ electrode labeled $C_3$, and shown as a second emitter in the circuit diagrams of FIGS. 2 and 4. This element is connected externally to the base of Q35. Normally, this element is not negative with respect to the base of Q40, so that no current will flow. However, as the amplifier output voltage gets close to zero, this element begins to serve as an inverted-mode collector (thus being labeled $C_3$), and collects current so as to limit the base drive at Q35. This prevents the saturation of Q40, and also controls the equilibrium points of the other transistors associated with Q35. In effect, the additional collector senses the onset of saturation in Q40, and operates through an interior feedback loop including Q35/Q39 to prevent further significant saturation while still developing the correct output signal. The result is that overload of the entire amplifier is prevented, and the output voltage can be driven down close to zero, even though only a single supply voltage is employed.

In accordance with a further aspect of the invention, the output signal from Q40 preferably is developed from a separate collector $C_2$ formed in a deep n+ plug extending down to the buried layer. This Kelvin connection avoids the effects of the voltage drop across the internal resistance between the conventional collector $C_1$ and the buried layer.

Figure 5:
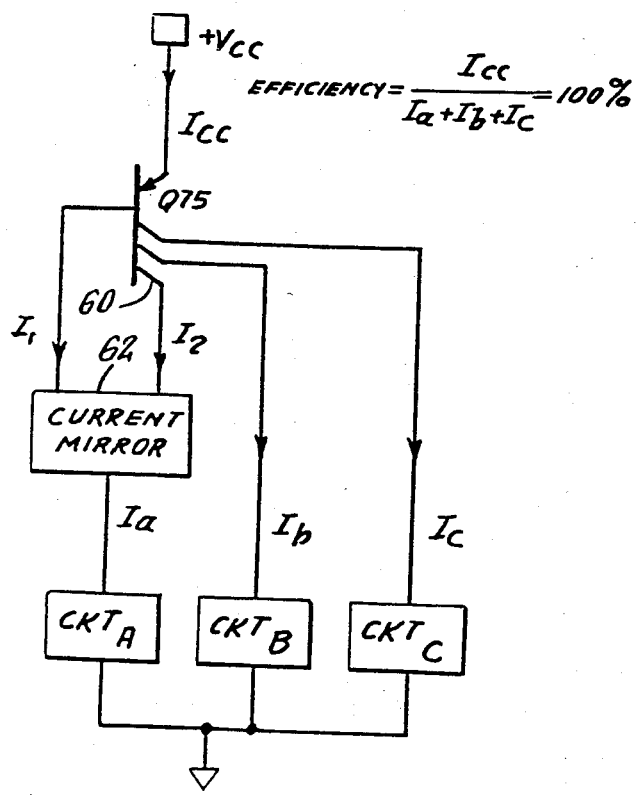
FIGS. 5 and 6 illustrate the functioning of the bias current network.
Figure 6:
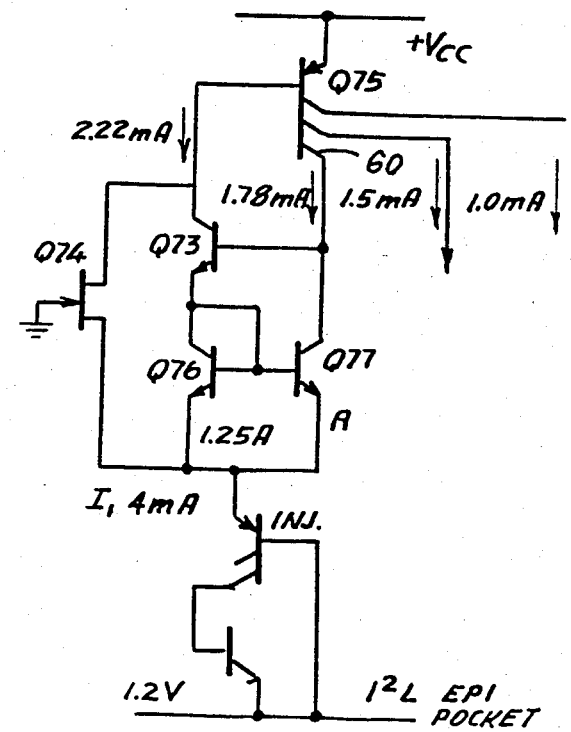

Referring now to FIGS. 5 and 6 as well as to the upper left-hand corner of FIG. 2A, the converter of this invention includes a unique highly efficient biasing network utilizing lateral PNPs developing the relatively high level currents required by the I$^2$L circuitry, the ECL control gate 20 and the reference supply for the current sources Q20–Q27. The single bias supply transistor Q75 is formed with split collectors proportioned for the respective required bias currents, and is deliberately operated in high level injection. Under these conditions, $\beta$ and $I_c$ (total) form a constant product, i.e. $\beta I_{cT} = K$. One collector 60 is connected to a current mirror 62 also connected to the base of Q75. In more detail, as shown in FIG. 6, collector 60 is connected to the base of a feedback transistor Q73 the collector of which is connected to the base of Q75. The collector 60 and the emitter of Q75 are connected to a pair of transistors Q76 and Q77 having emitters with an area ratio of 1.25:1, to establish that ratio of currents therethrough. The combined current is delivered to the I$^2$L main injector rail. (This rail is the more positive of the two supply connections to the I$^2$L circuitry, and is connected to all of the I$^2$L elements indicated schematically as half-arrow emitters; the more negative terminal is the buried layer.)

With the current mirror feedback shown, the base current $I_B$ for Q75 will be $\alpha I_{cT} \cdot M$, where $\alpha$ is the proportion of total collector current in collector 60, and M is the current mirror ratio. Since $\beta$ is defined as $I_{cT}/I_B$, it can be developed that $\alpha M = I_{cT}/K$, where K is the constant previously described, resulting from the initial device design characteristics. Thus, by properly adjusting $\alpha$ and M with reference to the requirements of the different circuit sections for bias currents, i.e. by fixing the relative areas of emitters of Q76 and Q77 and the split collectors of Q75, stable bias currents can be obtained for the individual circuit sections. Moreover, as will be apparent from FIG. 5, the circuit arrangement makes use of all of the current for biasing purposes, without loss. The circuit in effect recovers both the base current and the collector current of the feedback collector to be used as a current source for biasing purposes. FIG. 6 has been included alongside of FIG. 5 to permit ready comparison of the block diagram presentation with the actual circuitry.

Although a preferred embodiment of this invention has been described hereinabove in detail, it is desired to emphasize that this has been for the purpose of illustrating the invention, and should not be considered as necessarily limitative of the invention, it being understood that many modifications can be made by those skilled in the art while still practicing the invention claimed herein.

I claim:

1. In an IC digital-to-analog converter for use with a single supply voltage and operable to produce an output voltage referred to ground potential:
   a plurality of current sources to be activated in a pattern corresponding to an applied digital signal;
   means coupled to said current sources to produce an analog signal corresponding to the pattern of activation of said sources;
   a buffer amplifier having an input circuit receiving said analog signal and an output circuit for producing an output voltage corresponding to said analog signal;

said output circuit including a drive transistor including means to sense the onset of saturation in the transistor and to produce a corresponding saturation signal; and feedback means coupled to said sensing means and responsive to said saturation signal for reducing the level of the signal applied to said drive transistor as saturation begins to occur and developing an output voltage at levels near ground potential when said analog signal is near zero.

2. A converter as in claim 1, wherein said sensing means comprises a second emitter in said drive transistor normally non-conductive but which begins to draw current as its potential approaches the transistor base potential when the applied signal approaches zero.

3. A converter as in claim 2, including
a base-driven transistor producing an output which is coupled to the input of said drive transistor; and
means connecting said second emitter to the base of said base-driven transistor to limit the base current thereof as saturation is approached, thereby to correspondingly limit the signal applied to said drive transistor.

4. A converter as in claim 1, wherein
said drive transistor includes a first collector supplied with current;
a second collector for said drive transistor and diffused in a deep n+ plug extending down to the buried layer of the transistor; and
means connecting said second collector to provide an output signal for said amplifier.

5. A converter as in claim 1, including
a differential pair of transistors;
means connecting said analog signal to one of said differential pair; and
means connecting a signal to the other of said differential pair corresponding to the amplifier output voltage.

6. In an IC digital-to-analog converter,
a plurality of bipolar current source transistors;
a plurality of resistors connected to the emitters of said transistors respectively to set the current flow therethrough in accordance with the resistance of the resistor and the voltage between the transistor base and the end of the associated resistor which is remote from the emitter;
a plurality of inverted-mode transistor circuits each having a collector connected to the emitter of a respective one of said bipolar current source transistors;
a plurality of control circuits each responsive to one bit of a binary input signal and operable to direct a corresponding control signal to a corresponding one of said inverted-mode transistor circuits when the respective bit has a predetermined binary status;
said inverted-mode transistor circuits including means responsive to said control signal for activating the associated one of said collectors to collect the current normally flowing through the emitter of the bipolar transistor, thereby to prevent the flow of such current in the collector of the corresponding current source transistor.

7. A converter as in claim 6, wherein said inverted-mode transistor circuits each comprises a pair of inverted-mode transistors interconnected to form a flip-flop circuit.

8. A converter as in claim 6, wherein each of said control circuits comprises
a bipolar transistor activatable by a control gate signal and having a pair of emitters coupled to respective bases of a pair of inverted-mode transistors;
a data input transistor coupled to the base of one of said pair of inverted-mode transistors; and
means coupling respective collectors of each of said pair of inverted-mode transistors to said inverted-mode transistor circuits respectively to provide pairs of one-zero control signals to said circuits respectively in accordance with the binary state of each said data input transistor.

9. A converter as in claim 6, wherein
each current source transistor is a PNP transistor; and
an R/2R ladder connected to the collectors of said current source transistors to sum the currents thereof and to produce an analog output signal.

10. A converter as in claim 6, including on the same IC chip a buffer amplifier producing an output voltage corresponding to the analog output signal.

11. A converter as in claim 10, including
on the same IC chip a source of reference potential establishing a reference current; and
means to regulate the currents through said current source transistors to track said reference current.

12. An IC digital-to-analog converter comprising:
a plurality of transistor current sources each including an emitter resistor to set the current level therethrough;
a common emitter-resistor rail connecting the ends of said resistors which are remote from the transistors;
a comon base rail for said transistors;
a band-gap reference supply comprising at least two supply transistors operated at different current densities and operable to develop a band-gap reference voltage at least substantially unaffected by temperature changes;
means to develop a reference current proportional to said reference voltage;
a reference transistor matched to said transistor current sources;
a resistor connected between the emitter of said reference transistor and said emitter resistor rail;
means connecting the base of said reference transistor to said base rail; and
amplifier means for comparing the current through said reference transistor with said reference current and for adjusting the voltage of at least one of said rails to maintain the compared currents equal, thereby to stabilize the currents through said current source transistors.

13. A converter as claimed in claim 12, wherein said means to develop said reference current comprises a reference resistor connected across said band-gap reference voltage.

14. A converter as claimed in claim 13, wherein said reference transistor is connected in series with said reference resistor, whereby the band-gap voltage across said reference resistor is developed by current flowing through said reference resistor and is automatically regulated by said amplifier to be the required band-gap voltage.

15. A converter as in claim 12, wherein the bases of said two supply transistors are connected together;

a resistor network connected between the emitters of said supply transistors and a common line to develop a voltage proportional to the difference in base-to-emitter voltages of said two transistors between said common line and one of said emitters, whereby to produce a temperature-insensitive voltage between the base of that one transistor and said common line when that voltage is equal to the band gap voltage;

a reference resistor connected between said base of said one transistor and said common line; and means providing to the input of said amplifier a signal proportional to the relative currents flowing in the collectors of said two supply transistors, whereby the amplifier will automatically drive the voltage of said one rail to a level causing a current through said reference resistor which produces the required band-gap voltage between said base of said one supply transistor and said common line.

16. An IC digital-to-analog converter including on the same chip an output buffer amplifier to produce an output voltage corresponding to the DAC output; said amplifier comprising:

an input circuit with a differential set of transistors, one of which is an input transistor and receives the DAC output analog signal, the other being a feedback transistor to receive a balancing feedback signal proportional to the amplifier output voltage;

an output circuit for producing said output voltage; and an NPN current mirror having a first pair of transistors with their bases interconnected;

one of said first pair of transistors having its emitter connected to said input transistor, the other of said first pair having its emitter connected to said feedback transistor;

a fifth transistor coupling the collector of said first one of said pair to the common bases thereof;

a sixth transistor with its base driven by the second one of said first pair of transistors;

a second pair of transistors with their bases connected;

one of said second pair having its collector connected to the common bases of said first pair;

the collector of the other of said second pair being connected to the base thereof and to the emitter of said sixth transistor; and means coupling the emitter of said other of said second pair to said output circuit, to drive the output voltage in accordance with the DAC output.

17. An IC digital-to-analog converter comprising:

a power supply producing a unipolar d-c voltage with respect to the reference potential of a reference terminal;

a plurality of signal sources to be activated in a pattern corresponding to an applied digital signal and receiving power from said power supply;

means coupled to said signal sources to develop therefrom a unipolar analog signal with respect to said reference potential and corresponding in magnitude to the pattern of activation of said sources; and a buffer amplifier energized by said power supply, said buffer amplifier having an input circuit receiving said analog signal and an output circuit for producing an output voltage with respect to said reference potential in accordance with said analog signal;

said buffer amplifier including a drive transistor with saturation sensing means coupled to circuit means operable to adjust automatically the input signal to said drive transistor so as to reduce saturation effects, as they are sensed, thereby developing said output signal substantially in the full range between said reference potential and a second potential.

18. A converter as in claim 17, wherein said circuit means comprises feedback means coupled to said sensing means and responsive to said saturation signal for reducing the level of the signal applied to said drive transistor as saturation begins to occur and developing an output voltage at levels substantially at said reference potential when said analog signal is substantially at zero.

19. A converter as in claim 18, wherein said reference potential is ground.

20. An IC digital-to-analog converter comprising:

a power supply producing a d-c voltage with respect to the reference potential of a reference terminal;

a plurality of signal sources to be activated in a pattern corresponding to an applied digital signal;

means coupled to said signal sources to develop therefrom an analog signal corresponding in magnitude to the pattern of activation of said sources; and a buffer amplifier energized by said power supply, said buffer amplifier having an input circuit receiving said analog signal and an output circuit for producing an output voltage which is unipolar with respect to said reference potential and has a magnitude in accordance with said analog signal;

said buffer amplifier including a drive transistor with saturation sensing means; and circuit means coupled to said saturation sensing means and operable to adjust automatically the input signal to said drive transistor so as to reduce saturation effects, as they are sensed, and developing said output signal substantially in the full range between said reference potential and a second potential.

21. A converter as in claim 20, wherein said circuit means comprises feedback means coupled to said sensing means and responsive to said saturation signal for reducing the level of the signal applied to said drive transistor as saturation begins to occur and developing an output voltage at levels substantially at said reference potential when said analog signal is substantially at the corresponding end of its range of variation.

* * * * *